United States Patent
Bhat et al.

(10) Patent No.: US 10,209,336 B2
(45) Date of Patent: Feb. 19, 2019

(54) METHOD AND MAGNETIC RESONANCE APPARATUS FOR THE ACQUISITION OF CALIBRATION DATA USING SIMULTANEOUS ECHO REFOCUSING

(71) Applicant: Siemens Healthcare GmbH, Erlangen (DE)

(72) Inventors: Himanshu Bhat, Newton, MA (US); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 232 days.

(21) Appl. No.: 15/262,732

(22) Filed: Sep. 12, 2016

(65) Prior Publication Data

US 2017/0074960 A1    Mar. 16, 2017

Related U.S. Application Data

(60) Provisional application No. 62/218,066, filed on Sep. 14, 2015.

(51) Int. Cl.
  G01R 33/561    (2006.01)
  G01R 33/483    (2006.01)
  G01R 33/565    (2006.01)

(52) U.S. Cl.
  CPC ...... G01R 33/5611 (2013.01); G01R 33/4835 (2013.01); G01R 33/5616 (2013.01); G01R 33/56509 (2013.01)

(58) Field of Classification Search
  CPC .......... G01R 33/20; G01V 3/32; A61B 5/055; G01N 24/00
  USPC .......... 324/200, 300, 301, 307, 309
  See application file for complete search history.

(56) References Cited

U.S. PATENT DOCUMENTS

| | | | | |
|---|---|---|---|---|
| 9,991,716 B2* | 6/2018 | Cutright | ............... | G05B 19/048 |
| 9,992,855 B2* | 6/2018 | Larroux | ................... | H05G 1/58 |
| 2016/0178714 A1* | 6/2016 | Fautz | ................... | G01R 33/483 |
| | | | | 324/309 |
| 2017/0319097 A1* | 11/2017 | Amthor | ................... | A61B 5/055 |
| 2018/0024214 A1* | 1/2018 | Bhat | ................... | G01R 33/4828 |
| | | | | 324/309 |

OTHER PUBLICATIONS

Polimeni et al., "Reducing Sensitivity Losses Due to Respiration and Motion in Accelerated Echo Planar Imaging by Reordering the Autocalibration Data Acquisition" Magnetic Resonance in Medicine, vol. 75 (2016) pp. 665-679.

(Continued)

*Primary Examiner* — Giovanni Astacio-Oquendo
(74) *Attorney, Agent, or Firm* — Schiff Hardin LLP

(57) ABSTRACT

In a method and apparatus for acquiring magnetic resonance (MR) data, comprising an MR data acquisition scanner is operated, while a subject is situated therein, to acquire calibration data, and raw data for conversion into image data, by executing an accelerated echo planar imaging data acquisition sequence. The calibration data are acquired by executing a simultaneous echo refocusing sequence in which multiple slices of the examination subject are simultaneously excited. The calibration data and the acquired raw data are entered into an electronic memory during operation of said MR data acquisition scanner, and made available from a processor in electronic form, as at least one data file.

8 Claims, 4 Drawing Sheets

(56) References Cited

OTHER PUBLICATIONS

Bhat et al., "Motion Insensitivity ACS Acquisition Method for In-Plane and Simultaneous-Multi-Slice Accelerated EPI," Proc. Intl. Soc. Mag. Reson. Med. 22 (2014), 644.
Feinberg et al., "Simultaneous Echo Refocusing in EPI," Magnetic Resonance in Medicine, vol. 48 (2002) pp. 1-5.

\* cited by examiner

METHOD AND MAGNETIC RESONANCE APPARATUS FOR THE ACQUISITION OF CALIBRATION DATA USING SIMULTANEOUS ECHO REFOCUSING

RELATED APPLICATION

The present application claims the benefit of the filing date of provisional application 62/218,066, filed on Sep. 14, 2015, the contents of which are incorporated herein by reference.

BACKGROUND OF THE INVENTION

Field of the Invention

The present invention concerns methods and apparatuses for magnetic resonance imaging, and in particular to a method and a magnetic resonance apparatus for acquiring calibration data or reference data for use in reconstructing a magnetic resonance image from raw data acquired from an examination subject.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field (called the $B_0$ field), by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The acquired MR signals are digitized and entered into an electronic memory, organized as k-space, as k-space data. The k-space data are also referred to as raw MR data. The k-space memory has a number of individual locations that are available for entering the digitized signal thereat (data entry points), and the path of data entry points along which the digitized data are entered is called the k-space trajectory. The acquired data can be entered into k-space linearly (line-by-line of data entry points) or radially, along a straight or curved path proceeding from the center of k-space toward the periphery of k-space.

Many reconstruction algorithms are known for operating on the k-space data to convert the k-space data into image data representing an image of the volume of the examination object from which the raw MR data were acquired. This reconstruction algorithm is executed in an image reconstruction computer, resulting in an image data file from the computer that can be shown at the display screen of a monitor, or archived for storage.

After the nuclear spins have been flipped by the RF excitation pulse, the resulting MR signal exhibits an exponential decay in strength as the excited nuclear spins relax. This decaying signal is referred to as an echo signal, or simply as an echo. A commonly used data acquisition sequence of appropriately timed RF excitations and gradient pulse activations (switchings) is the echo planar imaging (EPI) sequence. In an EPI sequence, instead of measuring only one echo after each excitation pulse, multiple echoes are detected by multiple activations of the readout gradient after a single excitation pulse. In an EPI sequence, therefore, the total echo time of the decaying MR signal that follows the excitation of the nuclear spins is divided into a number of individual echo times, corresponding to the number of activated readout gradients.

The activation of sufficient magnetic resonance data (raw data) from an examination subject in order to be able to reconstruct an image of sufficient quality for most diagnostic purposes can be time consuming. Many patients find the amount of time that is necessary for the patient to be in the magnetic resonance data acquisition scanner, while the raw data are being acquired, to be an unpleasant experience because most magnetic resonance data acquisition procedures have, to varying degrees, a certain amount of noise, heat generation and claustrophobia associated therewith. It is also usually necessary for the patient to remain as motionless as possible for the duration of the data acquisition.

Additionally, from the point of view of the hospital or clinic that operates the magnetic resonance imaging apparatus, it is desirable to shorten the amount of time associated with each individual examination, so that patient throughput can be increased in order to facilitate recovery of the high cost of such a magnetic resonance apparatus.

Therefore, there is a continuing effort to decrease the amount of time that is necessary to conduct at least certain types of magnetic resonance imaging examinations.

Among the various techniques for shortening the duration of magnetic resonance data acquisition procedures are the GRAPPA (GeneRalized Autocalibration Partial Parallel Acquisition) and the simultaneous multislice (SMS) technique. These techniques, among others, can be generically called accelerated echo planar imaging, and require calibration data or reference data to be acquired prior to the imaging scan (i.e., the scan in which the actual raw data are acquired) in order to then be able to reconstruct an image from the acquired raw data. In the GRAPPA sequence, raw data are acquire simultaneously with a number of individual local coils. None of the individual local coils acquires enough raw data in order to reconstruct a complete image of the examination region therefrom, and so the respective individual sets of raw data acquired with the local coils must be combined in the reconstruction algorithm. In order to do so, it is necessary to acquire calibration data that identifies the sensitivity or the geometry or the location of the individual local coils.

In the SMS technique, raw data are acquired simultaneously from multiple slices of an examination subject, the multiple slices collectively forming the entirety of the region of interest of which an image is to be reconstructed. This is also a parallel acquisition technique, wherein the respective sensitivities of the multiple coils that acquire the raw data must be known, and this information therefore must be obtained in a calibration scan conducted prior to the imaging scan.

The reduction in the amount of time that is necessary to acquire a complete set of raw data, in order to then be able to reconstruct an image that does not exhibit aliasing, is quantified as the acceleration factor. For in-plane GRAPPA, fully sampled, low resolution datasets of each slice are acquired. As soon as the acceleration factor exceeds two, the data must be acquired in interleaved fashion in order to provide similar geometric distortion properties as will occur in the subsequent accelerated imaging scan.

An earlier conventional version of this data acquisition technique is shown in FIG. 1, designated "conventional." As shown in FIG. 1, the first segment (Seg. A) is acquired for the entire stack (composed in this example of Slice 1, Slice 2 and Slice 3). Afterwards the second segment (Seg. B) is acquired for the entire stack, and so on. For SMS imaging, the entire slice stack must be acquired in single-band fashion. The reconstruction kernels for the collapsed slices in the subsequent accelerated imaging scan are then calculated based on this reference or calibration scan.

Both gross patient motion and physiological motion (such as respiration) can severely corrupt this calibration scan, which might lead to artifacts in the reconstruction of the subsequent image data. This is particularly problematic for BOLD (Blood Oxygenation Level Dependent) imaging and diffusion acquisitions with multiple diffusion directions and averages, because every subsequently acquired imaging volume relies on the same separately acquired calibration data. calibration data acquired pre-movement may no longer be accurate after a movement has occurred.

Several ways to address these drawbacks have been proposed. One approach is the FLEET reference scan for GRAPPA calibration with high acceleration factors, as described by Polimeni et al., "Reducing Sensitivity Losses Due to Respiration and Motion in Accelerated Echo Planar Imaging by Reordering the Autocalibration Data Acquisition" Magnetic Resonance in Medicine, Vol. 75 (2016) pp. 665-679. The basis of this reference scan is to acquire all segments within one slice first, before proceeding to the next slice, as schematically illustrated in the FLEET sequence shown in the bottom portion of FIG. 1. This is achieved by utilizing special flip angle combinations.

Another approach extends the FLEET reference scan to multislice imaging, as proposed by Bhat et al., "Motion Insensitivity ACS Acquisition Method for In-Plane and Simultaneous-Multi-Slice Accelerated EPI," Proc. Intl. Soc. Mag. Reson. Med. 22 (2014), 644. In this extension of the FLEET reference scan, calibration data for slices that are to be acquired simultaneously in the subsequent imaging scan are acquired closer in time, in order to minimize the change of corrupted data acquisition. This approach is schematically illustrated in FIG. 2 for a two-segment acquisition and a stack of four slices wherein slices 1 and 3 are acquired simultaneously later one. The RF excitation pulses for the two segments are respectively designated $\alpha_1$, $\alpha_2$ and the subsequent echo signals (ADC signals) are also shown, with the associated readout and phase encoding gradients.

As can be seen from the bottom timeline in FIG. 2, the imaging readout for each slice takes place immediately after each block excitation.

SUMMARY OF THE INVENTION

An object of the present invention is to even further accelerate the data acquisition in echo planar imaging.

This object is achieved in accordance with the invention in a method and apparatus for the acquisition of magnetic resonance raw data wherein a further extension of the FLEET technique is employed. In accordance with the invention, the reference data are acquired using another multiband technique, which will be termed simultaneous echo refocusing (SER/SIR). With SER, multiple slices are excited with several subsequent single-band pulses. Gradients on the readout axis after each of these single-band pulses induce a shift along the readout direction in k-space. The ADC events in the subsequent readout echo train then acquire the k-space signals in all of the excited slices shifted on the readout axis. This allows the data for the respective slices to be easily separated by dividing the acquired k-space into sections of equal size.

Details of simultaneous echo refocusing (SER), but not applied to FLEET methods, can be found in Feinberg et al., "Simultaneous Echo Refocusing in EPI," Magnetic Resonance in Medicine, Vol, 48 (2002) pp. 1-5.

DESCRIPTION OF THE PREFERRED EMBODIMENTS

Figure 1:
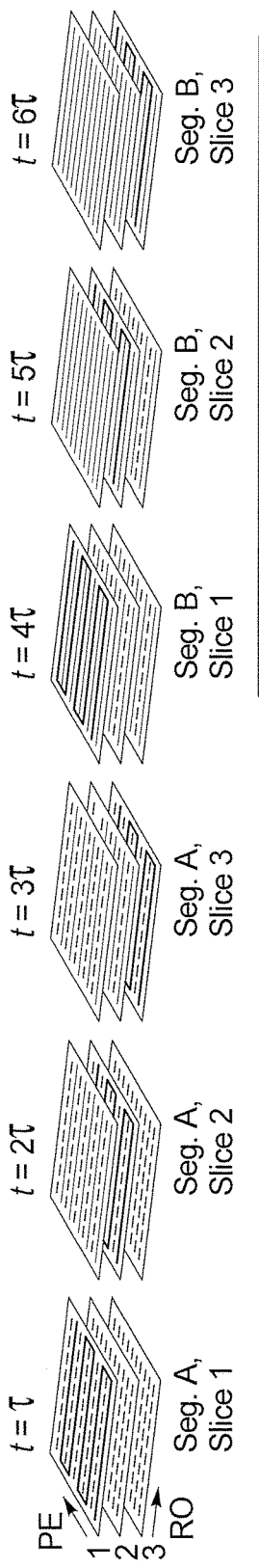
FIG. 1, as noted above, schematically illustrates a conventional accelerated EPI reference scan technique and the known FLEET technique.
Figure 1:
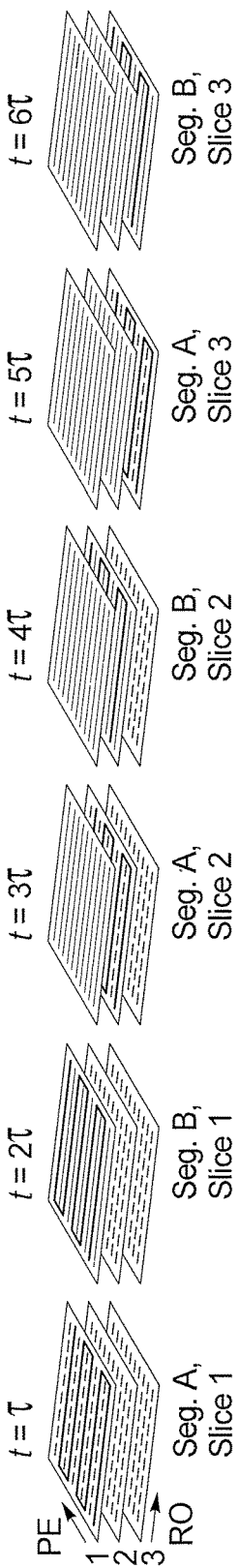
Figure 2:
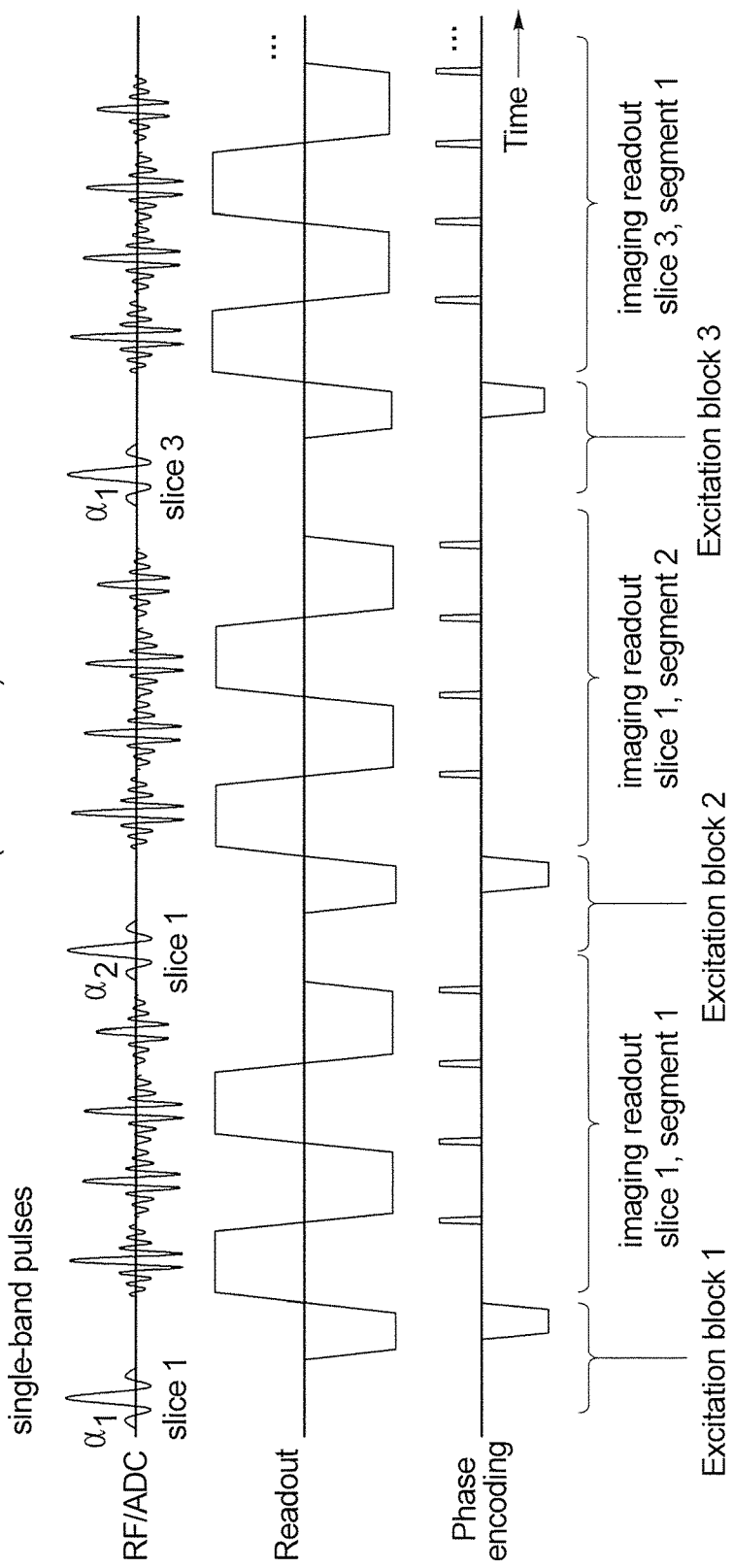
FIG. 2, as noted above, schematically illustrates the extended FLEET technique described in the aforementioned article by Bhat et al.
Figure 3:
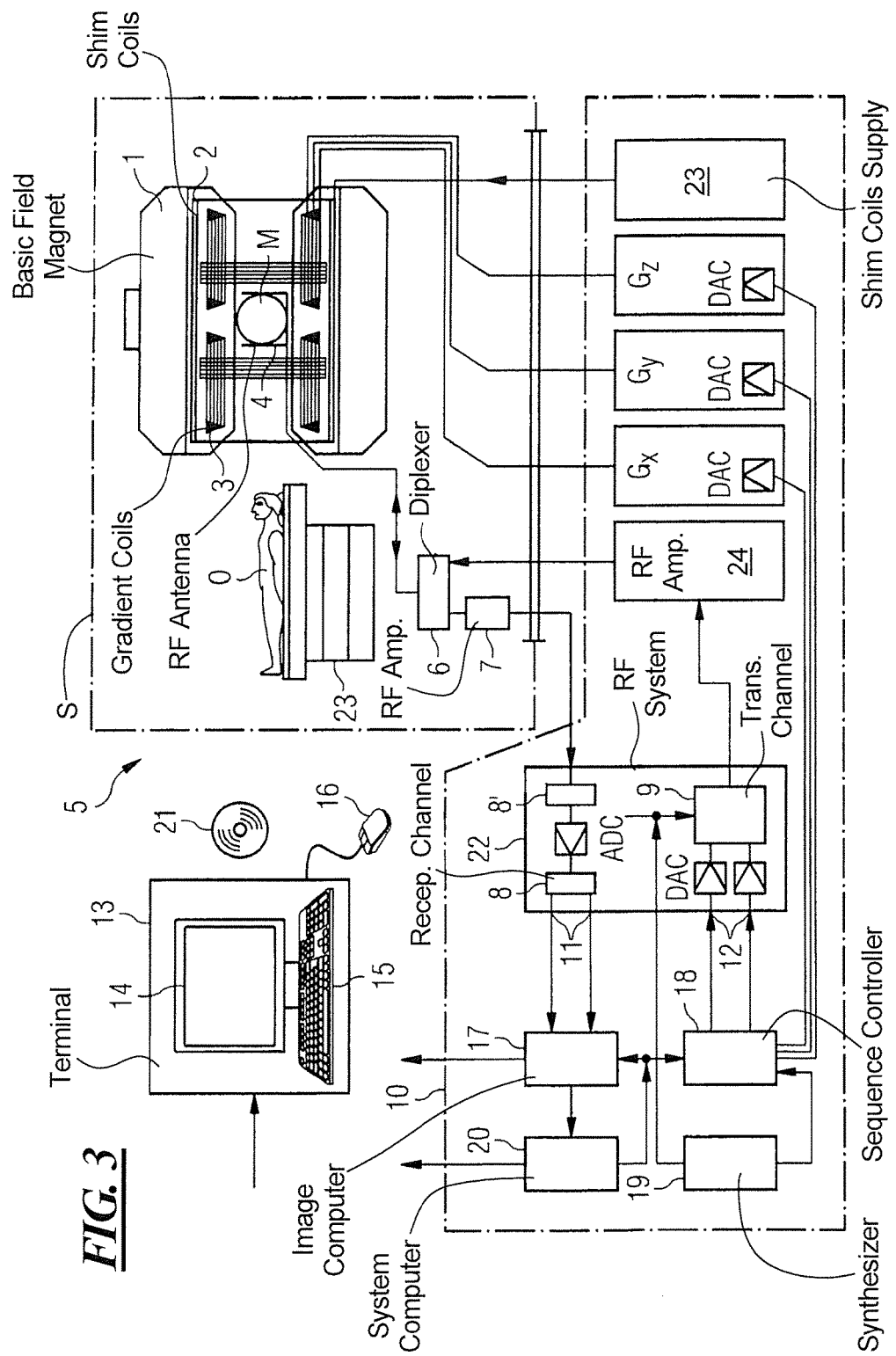
FIG. 3 schematically illustrates a magnetic resonance apparatus constructed and operating in accordance with the present invention.

FIG. 3 schematically illustrates a magnetic resonance apparatus 5 (a magnetic resonance imaging or tomography device). A basic field magnet 1 generates, a temporally constant, strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

Figure 4:
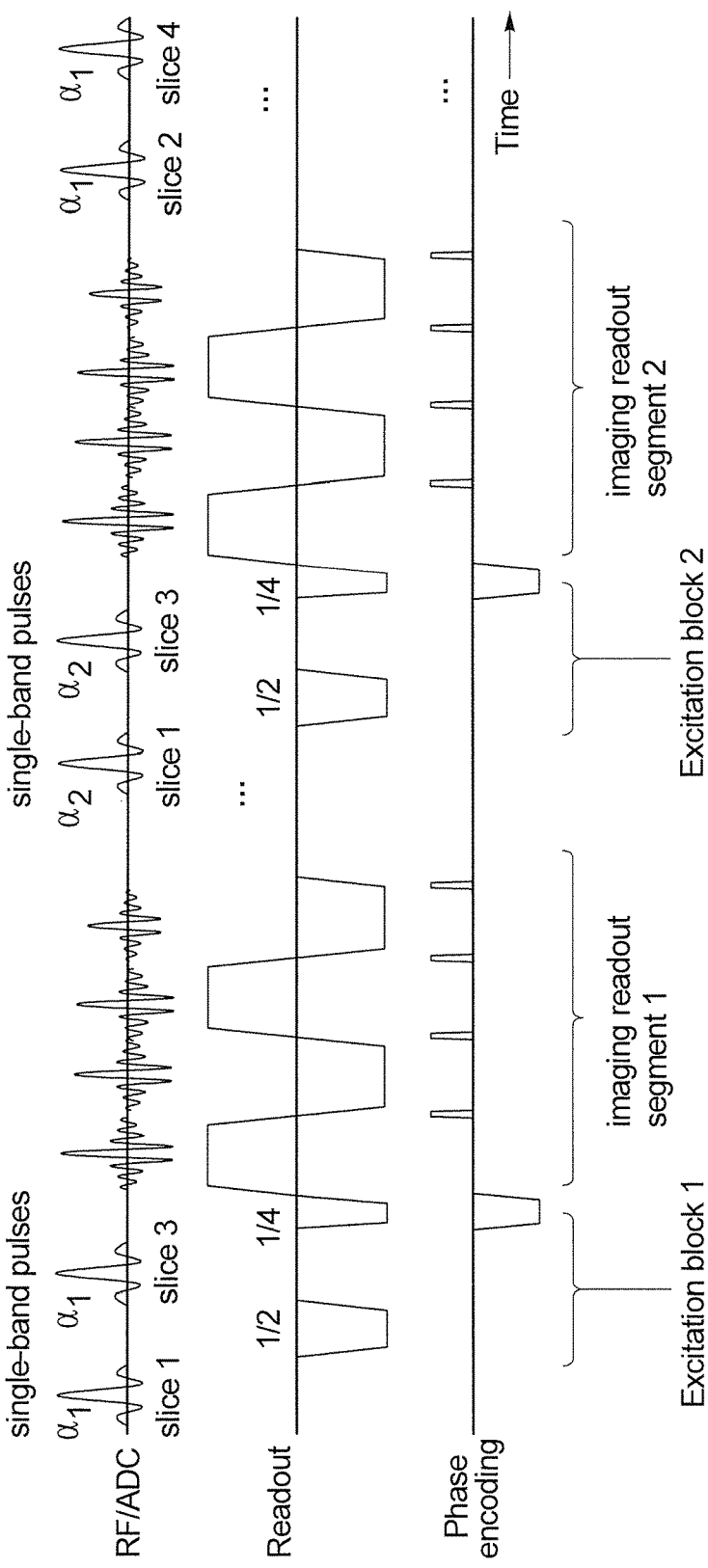
FIG. 4 schematically illustrates a pulse sequence for the acquisition of calibration data in accelerated EPI in accordance with the present invention.

The acquisition scheme of the multiple segments starts with the aforementioned procedure described in the article by Polimeni et al. The slices which will be later acquired simultaneously by are, in accordance with the invention, excited and acquired simultaneously using SER, as shown in FIG. 4. This ensures that these slices all are affected by the same patient motion and respiration influences, which leads to improved calibration results. The simultaneous slice acquisition can be done using blipped CAIPIRINHA (which is described in Setsompop et al., "Blipped Controlled Aliasing in Parallel Imaging for Simultaneous Multislice Echo Planar Imaging with Reduced g-factor Penalty," Magnetic Resonance in Medicine, Vol. 67, pp. 1210-1224 (2012)) or another suitable SMS sequence.

Furthermore, the number of required readout trains is reduced by the multiband factor, which reduces the acquisition time of the reference scan. This principle could also be applied to conventional single-band imaging scans, in order to shorten the acquisition time of the reference scan.

Similar geometric distortion can be ensured by matching the ADC length and bandwidth to the properties of the subsequent imaging scan, i.e. ensure that the effective echo spacing between respective ADC events remains comparable between imaging and reference scan. Any loss of spatial resolution that may occur in the readout direction should not be critical, because the reconstruction kernels can be calibrated using low-resolution datasets, comparable to GRAPPA.

The inventive approach therefore acquires reference data for blipped CAIPIRINHA or GRAPPA with SER, instead of using a conventional single-band acquisition.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data, comprising:
   generating control signals in a processor and providing the control signals from the processor to an MR data acquisition scanner, while a subject is situated therein, in order to operate the data acquisition scanner so as to acquire calibration data, and raw data for conversion into image data, by executing an accelerated echo planar imaging data acquisition sequence;
   with said control signals, operating said MR data acquisition scanner to acquire said calibration data by executing a simultaneous echo refocusing sequence in which multiple slices of the examination subject are simultaneously excited;
   providing the calibration data and the acquired raw data from the MR data acquisition scanner to the processor and, via the processor, entering the calibration data and the acquired raw data into an electronic memory during operation of said MR data acquisition scanner; and
   with said processor, accessing said memory and making said calibration data and said raw image data available from said processor in electronic form, as at least one data file.

2. The method as claimed in claim 1 comprising operating said MR data acquisition scanner with a simultaneous multislice imaging sequence as said accelerated echo planar imaging sequence.

3. The method as claimed in claim 2 comprising operating said MR data acquisition scanner with a blipped CAIPIRINHA sequence as said simultaneously multislice sequence.

4. The method as claimed in claim 1 comprising operating said MR data acquisition unit to execute a GRAPPA sequence as said accelerated echo planar imaging sequence.

5. A magnetic resonance (MR) apparatus comprising:

an MR data acquisition scanner;

a control computer configured to operate the MR data acquisition scanner, while a subject is situated therein, to acquire calibration data, and raw data for conversion into image data, by executing an accelerated echo planar imaging data acquisition sequence;

said control computer configured to operate said MR data acquisition scanner to acquire said calibration data by executing a simultaneous echo refocusing sequence in which multiple slices of the examination subject are simultaneously excited;

an electronic memory;

said control computer being configured to enter the calibration data and the acquired raw data into said electronic memory during operation of said MR data acquisition scanner; and said control computer being configured to access said electronic memory and make said calibration data and said raw image data available from said control computer in electronic form, as at least one data file.

6. The apparatus as claimed in claim 5 wherein said control computer is configured to operate said MR data acquisition scanner with a simultaneous multislice imaging sequence as said accelerated echo planar imaging sequence.

7. The apparatus as claimed in claim 6 wherein said control computer is configured to operate said MR data acquisition scanner with a blipped CAIPIRINHA sequence as said simultaneously multislice sequence.

8. The apparatus as claimed in claim 5 wherein said control computer is configured to operate said MR data acquisition unit to execute a GRAPPA sequence as said accelerated echo planar imaging sequence.

* * * * *